US008933437B2

(12) United States Patent  
Morita et al.

(10) Patent No.: US 8,933,437 B2  
(45) Date of Patent: Jan. 13, 2015

(54) ORGANIC SEMICONDUCTOR MATERIAL WITH NEUTRAL RADICAL COMPOUND OF A TRIOXOTRIANGULENE DERIVATIVE AS A SEMICONDUCTOR MATERIAL

(75) Inventors: Yasushi Morita, Kawanishi (JP); Masaaki Yokoyama, Toyonaka (JP); Shozo Yanagida, Kawanishi (JP); Yoshihisa Tawada, Osaka (JP); Kenji Yamamoto, Settsu (JP); Ryotaro Tsuji, Osaka (JP)

(73) Assignee: Kaneka Corporation, Osaka-shi (JP)

( * ) Notice: Subject to any disclaimer, the term of this patent is extended or adjusted under 35 U.S.C. 154(b) by 399 days.

(21) Appl. No.: 13/131,003

(22) PCT Filed: Nov. 25, 2009

(86) PCT No.: PCT/JP2009/006360  
§ 371 (c)(1),  
(2), (4) Date: Jun. 30, 2011

(87) PCT Pub. No.: WO2010/061595  
PCT Pub. Date: Jun. 3, 2010

(65) Prior Publication Data  
US 2012/0126206 A1 May 24, 2012

(30) Foreign Application Priority Data

Nov. 27, 2008 (JP) .................................. 2008-302912

(51) Int. Cl.  
*H01L 51/30* (2006.01)  
*H01L 51/00* (2006.01)  
*H01L 51/42* (2006.01)  
*H01L 51/50* (2006.01)

(52) U.S. Cl.  
CPC ........... *H01L 51/0056* (2013.01); *H01L 51/424* (2013.01); *H01L 51/5012* (2013.01); *H01L 51/5048* (2013.01); *H01L 51/5088* (2013.01); *Y02E 10/549* (2013.01); *Y10S 428/917* (2013.01)  
USPC ....... 257/40; 428/690; 428/917; 257/E51.024

(58) Field of Classification Search  
None  
See application file for complete search history.

(56) References Cited

U.S. PATENT DOCUMENTS

| 5,475,341 A | 12/1995 | Reed |
| 5,589,692 A | 12/1996 | Reed |
| 5,811,833 A * | 9/1998 | Thompson ...................... 257/40 |
| 6,320,200 B1 | 11/2001 | Reed et al. |
| 6,430,511 B1 | 8/2002 | Tour et al. |
| 6,756,605 B1 | 6/2004 | Reed et al. |
| 2002/0175326 A1 | 11/2002 | Reed et al. |
| 2003/0058697 A1 | 3/2003 | Tour et al. |
| 2003/0218166 A1 * | 11/2003 | Tsutsui ........................... 257/40 |
| 2005/0104062 A1 | 5/2005 | Reed et al. |
| 2008/0135083 A1 * | 6/2008 | Lai et al. ....................... 136/244 |

FOREIGN PATENT DOCUMENTS

| JP | 05259493 A | 10/1993 |
| JP | 2002155010 A | 5/2002 |
| JP | 2004-518268 A | 6/2004 |
| JP | 2007-227186 A | 9/2007 |

OTHER PUBLICATIONS

ISA Japanese Patent Office, International Search Report of PCT/JP2009/006360, Jan. 12, 2010, 4 pages.  
Allinson, Graeme et al., "Synthesis of a Derivative of Triangulene: the First Non-Kekule Polynuclear Aromatic," Journal of the Chemical Society—Perkin Transactions 1, 1995, Issue 4, pp. 385-390, 6 pages.  
Allinson, Graeme et al., "The Synthesis of singlet ground state derivatives of non-Kekule polynuclear aromatics," Journal of the Chemical Society—Perkins Transaction 2, 1997, Issue 2, pp. 147-156, 12 pages.  
Tsukada, Masaru et al., "Theory of nanostructured conductance," Journal of the Physical Society of Japan, vol. 59, No. 7, Jul. 5, 2004, pp. 452-459, 8 pages.  
ISA The International Bureau of WIPO, International Preliminary Report on Patentability for International Application No. PCT/JP2009/006360, Jun. 9, 2011, 11 pages.

* cited by examiner

*Primary Examiner* — Andrew K Bohaty  
(74) *Attorney, Agent, or Firm* — Alleman Hall McCoy Russell & Tuttle LLP

(57) ABSTRACT

An organic semiconductor device according to the present invention includes a semiconductor layer 14 interposed between two electrodes 12 and 15, and the semiconductor layer 14 contains a trioxotriangulene (TOT) derivative, which is a neutral radical compound, as a semiconductor material. The semiconductor layer 14 acts as an n-type semiconductor and coacts with a p-type semiconductor layer 13 to exhibit a photoelectric conversion effect. The organic semiconductor device is characterized as including a semiconductor layer that has a narrow band gap, has light absorption performance in an infrared region, and is high in carrier mobility.

7 Claims, 9 Drawing Sheets

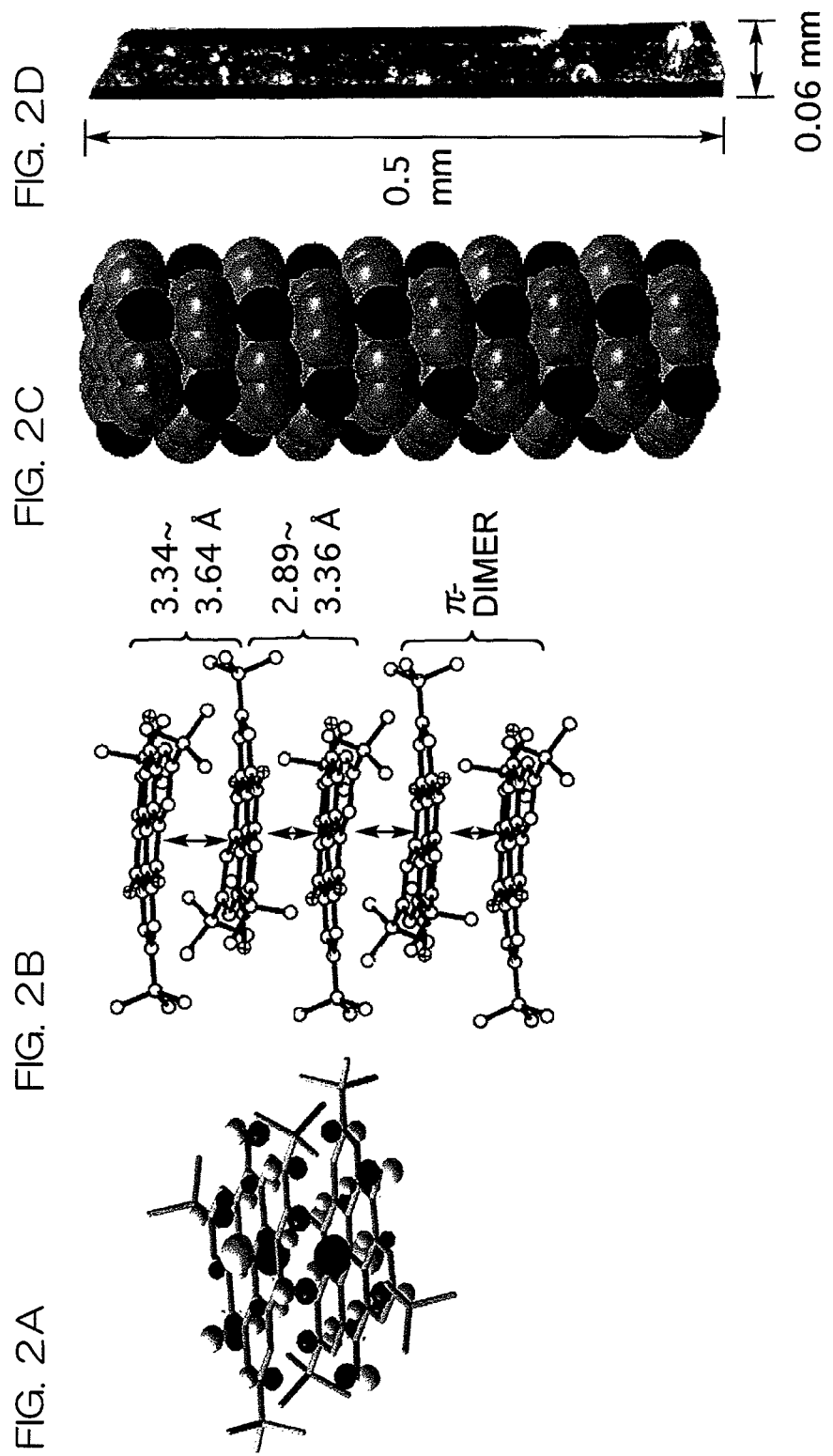

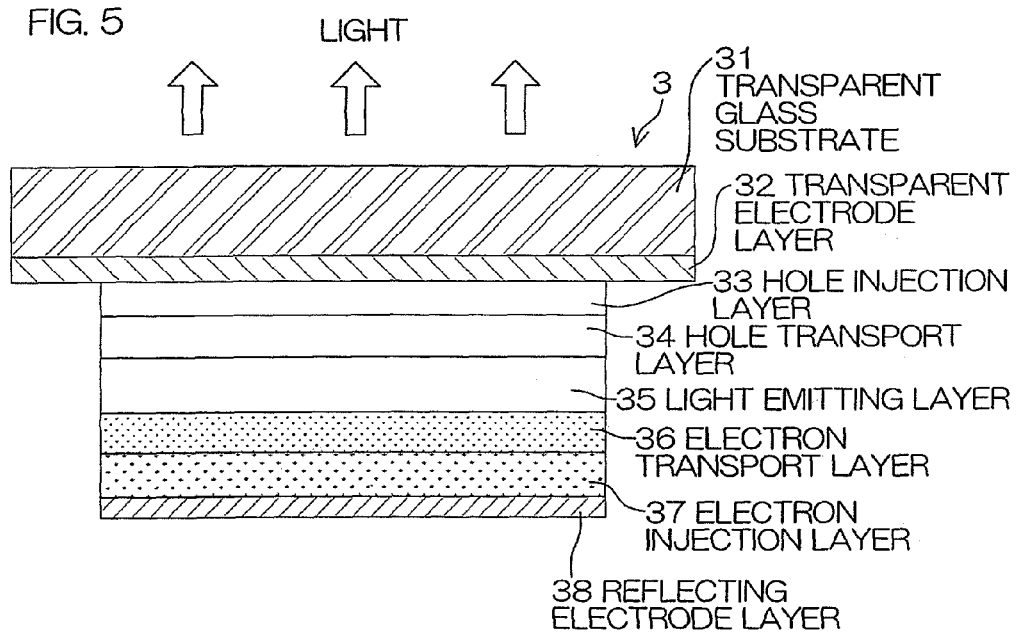
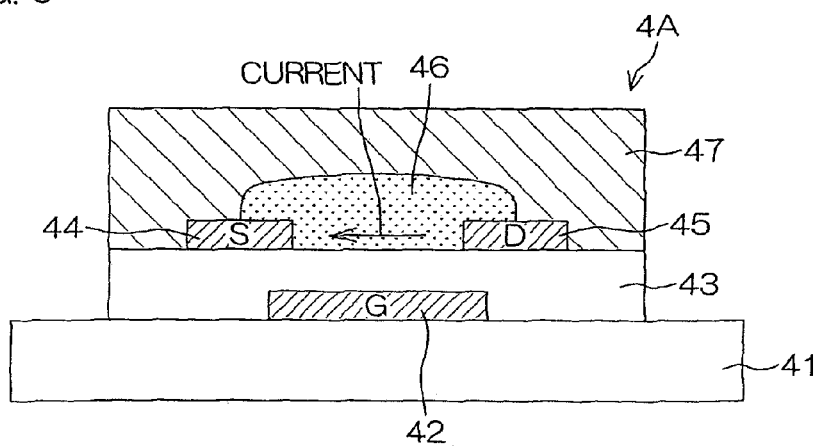

ORGANIC SEMICONDUCTOR MATERIAL WITH NEUTRAL RADICAL COMPOUND OF A TRIOXOTRIANGULENE DERIVATIVE AS A SEMICONDUCTOR MATERIAL

FIELD OF THE ART

The present invention relates to an organic semiconductor device that contains a neutral radical compound having a π-electron system.

BACKGROUND ART

Organic semiconductor devices include such types as organic solar cells, organic electroluminescence devices (organic EL devices), and organic field effect transistors. From before, a number of compounds including such as phthalocyanine, pentacene, and oligothiophene have been developed as organic compounds that serve as p-type semiconductors to transport holes in an organic semiconductor device.

However, n-type semiconductors to transport electrons are limited to fullerene, perylene tetracarboxylic acid diimide, perfluoropentacene, etc., and research and development thereof are delayed in comparison to the p-type. An essential reason for this is considered to be instability of an organic molecular anion (a radical anion species, to be accurate) produced by a closed-shell organic molecule receiving a single electron.

Also, although not in the field of organic semiconductor devices, there is known an arrangement related to a secondary battery in which an organic compound having a phenalenyl skeleton or a derivative thereof is used as an active substance included in a positive electrode (see Patent Document 1 below). In the Patent Document 1, a trioxotriangulene (TOT) derivative is cited as an example of the organic compound having the phenalenyl skeleton (see Formula (a-3) in Chemical Formula (4) cited in Patent Document 1). However, there is no suggestion in Patent Document 1 of rendering the organic compound function as an organic semiconductor device by using it in a semiconductor layer of an organic semiconductor device.

PRIOR ART DOCUMENT(S)

Patent Documents

Patent Document 1: Japanese Unexamined Patent Publication No. 2007-227186 (molecular crystalline secondary battery)

SUMMARY OF THE INVENTION

In organic semiconductors, low conductivity and low carrier mobility are the greatest bottlenecks when using conventional materials. An organic field effect transistor made using a conventional organic semiconductor is thus low in operating frequency. Operation at a large electric current is also difficult with organic EL devices and organic solar cells.

Also, representative organic semiconductors that are known so far have a HOMO (highest occupied molecular orbital)-LUMO (lowest unoccupied molecular orbital) energy difference as large as 1.0 to 1.7 eV. The organic semiconductors thus cannot absorb light of low energy corresponding to an infrared region. If an organic semiconductor device that absorbs light of low energy can be realized, it can be arranged in a tandem structure with a semiconductor device combined with a large band gap to improve solar light absorption efficiency.

Due to such reasons, emergence of a semiconductor device that uses a novel, n-type organic semiconductor of excellent infrared absorption efficiency and high mobility is desired.

An object of the present invention is to provide an organic semiconductor device that includes a semiconductor layer that has a narrow band gap and thus has light absorption performance in an infrared region and yet is high in carrier mobility.

An organic semiconductor device according to the present invention includes at least one semiconductor layer, and the semiconductor layer contains a trioxotriangulene (TOT) derivative that is a neutral radical compound shown in Chemical Formula (1) below as a semiconductor material. Here, "neutral radical compound" refers to an electrically neutral organic compound having an unpaired electron. "Semiconductor material" refers to a material that is contained in the semiconductor layer and imparts a semiconductor characteristic to the semiconductor layer.

Chemical Formula (1)

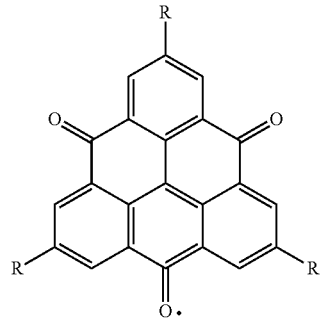

(1)

(In the above Chemical Formula (1), "R" indicates a monovalent group.)

With the above semiconductor layer, there may be a case where the neutral radical compound of Chemical Formula (1) is in a crystalline arrangement of being layered in columnar form.

The TOT derivative is a neutral radical compound that has a condensed polycyclic type molecular structure having a gigantic π-electron system and with which an electron spin is broadly delocalized across an entire molecular skeleton. Here, "spin localized" refers to a structure in which the electron spin is localized to a limited portion of the molecular skeleton, and "spin delocalized" refers to a structure in which the electron spin is broadly distributed over the entire molecular skeleton.

The TOT derivative is a condensed polycyclic type, "spin delocalized" neutral radical compound of high planarity that has a gigantic π-electron system of 25π for a neutral open-shell organic molecule. Strong intermolecular interaction and high self-assembling ability can thus be anticipated.

As the monovalent group "R" in Chemical Formula (1), a monovalent functional group selected from the group consisting of a proton, a methyl group, an ethyl group, an n-propyl group, an isopropyl group, an n-butyl group, a t-butyl group, a cyclohexyl group, a 2,2,2-trifluoroethyl group, a pentafluoroethyl group, a heptafluoroisopropyl group, a phenyl group, a 4-methoxyphenyl group, a pentafluorophenyl group, a naphthyl group, a benzyl group, a methoxy group, an ethoxy group, an n-butoxy group, a t-butoxy group, a phenyloxy group, an amino group, a dimethylamino group, a diethylamino group, an isopropylamino group, a carboxyl group, a methoxycarbonyl group, an ethoxycarbonyl group, an isopropoxycarbonyl group, a t-butoxycarbonyl group, a trifluoromethoxycarbonyl group, a cyano group, a nitrile group, and halogens may be used.

As an example of the TOT derivative, structures of a tert-butyl derivative, with which the "R" in Chemical Formula (1) is the t-butyl group are shown in FIG. 1A to FIG. 1C. FIG. 1A is a structural diagram of a spin localized type molecular structure of the trioxotriangulene (TOT) derivative having three tert-butyl groups. FIG. 1B is a structural diagram of a "spin delocalized type" molecular structure that reflects the actual electron structure. FIG. 1C is a schematic diagram of a spin density distribution determined from quantum chemical calculations with large spheres of dark color indicating a positive spin density distribution and small spheres of light color indicating a negative spin density distribution.

A crystal of the TOT derivative is obtained as a black, hexagonal prismatic crystal. As an example, crystal structures of the tert-butyl derivative determined by X-ray crystallographic analysis are shown in FIG. 2A to FIG. 2D. FIG. 2A is a diagram of a dimer structure (π-dimer) of the TOT derivative and shows an electron distribution state of SOMOs (singly occupied molecular orbitals). FIG. 2B is a diagram showing that the π-dimers are layered in columnar form in one dimensional direction (direction of the arrows in FIG. 2B) and shows that an interlayer distance inside each π-dimer is less than a distance between π-dimers. FIG. 2C is a schematic view showing, as an electron cloud distribution, a crystal structure of the TOT derivative (with the tert-butyl group omitted) in which a plurality of π-dimers are layered. FIG. 2D is an outer appearance of a monocrystal.

As shown in FIG. 2A, in the crystal of the TOT derivative, the π-dimer is formed so that positions of large SOMO coefficient (positions at which the positive electron spin density distribution is large) overlap mutually, and as shown in FIG. 2B, the π-dimer has a short non-bonding distance (2.89 to 3.36 Å). Further, other π-dimers are layered above and below the π-dimer at distances of 3.34 to 3.64 Å, thereby forming a one-dimensional columnar structure (see FIGS. 2B and 2C).

In this way, π-type neutral radical compound molecules which are deposited substantially perpendicularly to a molecular plane form a laminate structure not present in the conventional art, with a high propensity to self-assemble. This is considered to be due to a strong influence of the gigantic π-electron system and the effect of the electron spin that is broadly delocalized across the skeleton.

The TOT derivative has degenerate LUMO. In contrast to the HOMO-LUMO energy difference of a representative, conventionally-known organic semiconductor device being 1.0 to 1.7 eV, a SOMO-LUMO energy difference (energy gap) of the TOT derivative having three tert-butyl groups is, according to calculations, only approximately 0.2 eV (from a calculation result by a ROBLYP/6-31G (d, p)//UBLYP/6-31G (d, p) method). Although problems, such as electron repulsion between orbitals, are highly involved in this energy difference, an organic molecule with such an extremely small gap between frontier orbital energies was previously unknown. Use of such a small energy difference makes absorption of a wide range of long-wavelength light energy reaching an infrared region possible and makes utilization of infrared light that is directly linked to improvement in photocurrent in a solar cell or other photoelectric conversion device possible.

Also, the TOT derivative has a decomposition temperature of no less than 300 degrees Celsius even in air and thus provides a high stability comparable even to closed-shell molecules and is excellent in durability and lifetime as an organic semiconductor device.

Also, as an organic semiconductor device, the TOT derivative has a high carrier mobility of 0.01 to 20 $cm^2/Vs$, and by making use of the magnitude of the carrier mobility, an excellent n-type semiconductor material can be provided by the TOT derivative.

As described above, with the present invention, by using the neutral radical compound made up of the TOT derivative as an organic semiconductor material, a stable organic semiconductor device that can be applied to an organic thin-film solar cell or hybrid solar cell that photoelectrically converts light of the infrared region, an organic EL device of high emission intensity, an organic transistor of high operation frequency, etc., can be obtained favorably.

The above and other merits, characteristics, and effects of the present invention shall be made clearer by the following description of preferred embodiments with reference to the attached drawings.

BRIEF DESCRIPTION OF THE DRAWINGS

FIG. 2A is a diagram of a dimer structure (π-dimer) obtained by X-ray crystallographic analysis and in which two TOT derivatives are layered.

FIG. 2B is a diagram of a crystal structure showing that the π-dimers of the TOT derivative are layered in columnar form in one dimensional direction (direction of the arrows in FIG. 2B).

FIG. 2C is a schematic view expressing, as an electron cloud distribution, a crystal structure of the TOT derivative (with the tert-butyl group omitted) in which a plurality of π-dimers are layered.

FIG. 2D is an outer appearance of a monocrystal.

FIG. 5 is a schematic view of an organic EL device in which the TOT derivative is incorporated in an electron transport layer 36 and an electron injection layer 37.

FIG. 6 is a schematic view of an organic transistor (bottom contact type) in which the TOT derivative is incorporated in a semiconductor layer 46.

DETAILED DESCRIPTION OF EMBODIMENTS

Preferred embodiments of the present invention shall now be described in detail with reference to the drawings.

<Organic Thin-Film Solar Cell>

An organic thin-film solar cell that converts light within an infrared region to electric power can be manufactured by using a TOT derivative having a narrow SOMO-LUMO energy gap and absorbing a wide range of long-wavelength light reaching the infrared region as an n-type semiconductor layer of the organic thin-film solar cell.

A material for a solar cell that uses infrared rays is not only required to absorb in the infrared region but is also required to be capable of moving generated electrons and holes separately without recombination, and the TOT derivative is an optimal compound for this purpose because it exhibits a high carrier mobility of 0.01 to 20 $cm^2$/Vs As shall be described in the (Examples) section, with the TOT derivative, frontier orbital levels can be controlled as suited by molecular design, such as a change of substituent structure. This enables fine tuning of characteristics required as a pn junction layer of a solar cell, such as electrode work function (Fermi level), semiconductor valence band (HOMO, SOMO) and conduction band (LUMO) levels.

Figure 1A:
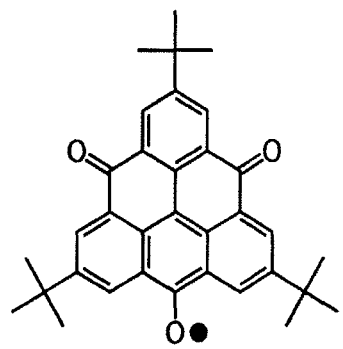
FIG. 1A is a structural diagram of a spin localized type molecular structure of the trioxotriangulene (TOT) derivative having three tert-butyl groups.
Figure 1B:
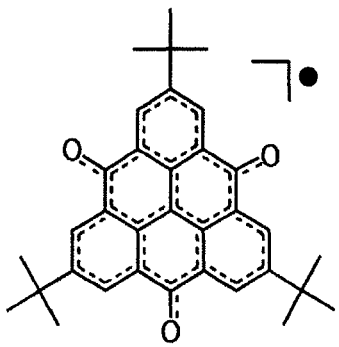
FIG. 1B is a "spin delocalized type" molecular structure that reflects the actual electron structure.
Figure 1C:
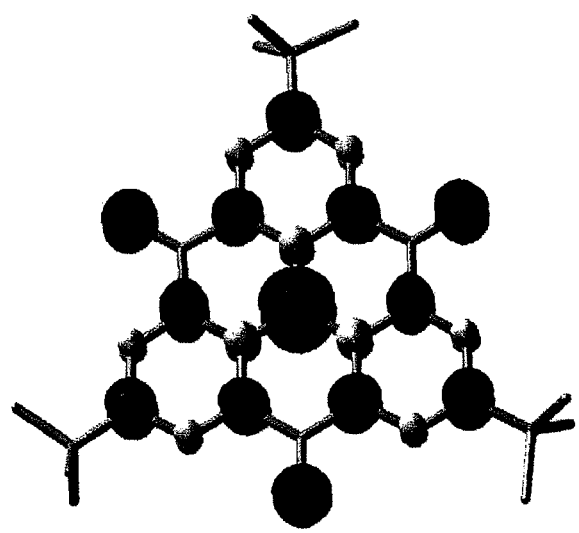
FIG. 1C is a schematic diagram of a spin density distribution determined from quantum chemical calculations.
Figure 3:
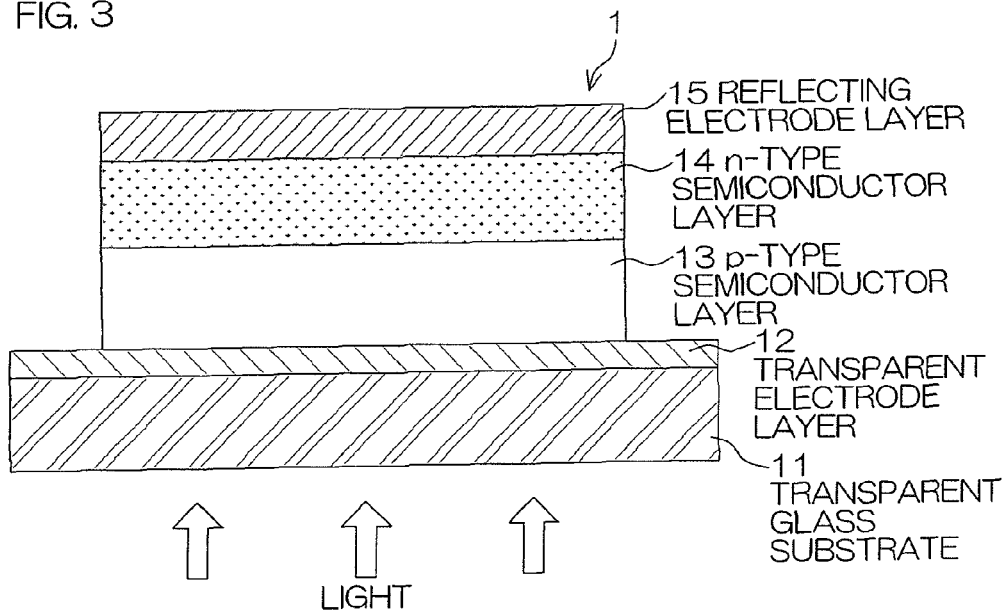
FIG. 3 is a schematic view of an organic thin-film solar cell 1 in which a TOT derivative is incorporated in a semiconductor layer 14.

FIG. 3 is a schematic sectional view of an organic thin-film solar cell in which the TOT derivative is used in an n-type semiconductor layer. In the organic thin-film solar cell 1, a transparent electrode layer 12 made of tin dioxide ($SnO_2$), etc., a p-type semiconductor layer 13, an n-type semiconductor layer 14, and a reflecting electrode layer 15 are laminated in that order on a transparent glass substrate 11. A buffer layer may be provided between the transparent electrode layer 12 and the p-type semiconductor layer 13, and a buffer layer may be provided between the n-type semiconductor layer 14 and the reflecting electrode layer 15. The n-type semiconductor and the p-type semiconductor do not necessarily have to be a laminated structure and may be a bulk heterojunction structure instead. There also may be case where an i (intrinsic semiconductor) layer is inserted between the p-type semiconductor layer 13 and the n-type semiconductor layer 14. A mixed layer of the p-type semiconductor and the n-type semiconductor is used as the i-layer. Further, an organic thin-film solar cell that does not have the p-type semiconductor layer 13 and the n-type semiconductor layer 14 and has only the i layer using the mixed layer can also be realized.

The TOT derivative acts as an n-type semiconductor and it must thus be combined with a p-type semiconductor to arrange a heterojunction type solar cell. Here, pentacene, tetrathiafulvalene, thienothiophene, polythiophene, polyphenylenevinylene, etc., can be cited as examples of an optimal p-type semiconductor.

To briefly describe an example of a method of manufacture, the transparent electrode layer 12 is vapor deposited onto the transparent glass substrate 11 by a sputtering method, etc. The p-type semiconductor layer 13 is then formed from above by a vacuum vapor deposition method or a coating method, and the n-type semiconductor layer 14 is formed on the p-type semiconductor layer 13 by the vacuum vapor deposition method or the coating method. In the thin-film forming process, conditions must be set to optimize mutual stacking of molecules. Specifically, in the case of the vacuum vapor deposition method, the optimal conditions are set by adjusting such parameters as temperatures, temperature ramp profiles, vapor deposition times of a vapor deposition source and a substrate, and a distance between the vapor deposition source and the substrate. Also in the case of the coating method, in addition to selecting a coating process, such as spin coating, inkjet, and gravure printing, optimal conditions are set by adjusting such parameters as a solvent type, concentration, temperature, and drying conditions of a coating solution. Finally, the reflecting electrode layer 15 is formed on the n-type semiconductor layer 14 by the sputtering method, etc.

It is predicted that irradiation of the organic thin-film solar cell 1, manufactured according to the above arrangement, with light in the infrared region having a wavelength of no less than 0.8 μm (AM1.5:1 $kW/m^2$ light source), can generate a short-circuit current of no less than 7 $mA/cm^2$.

Figure 4:
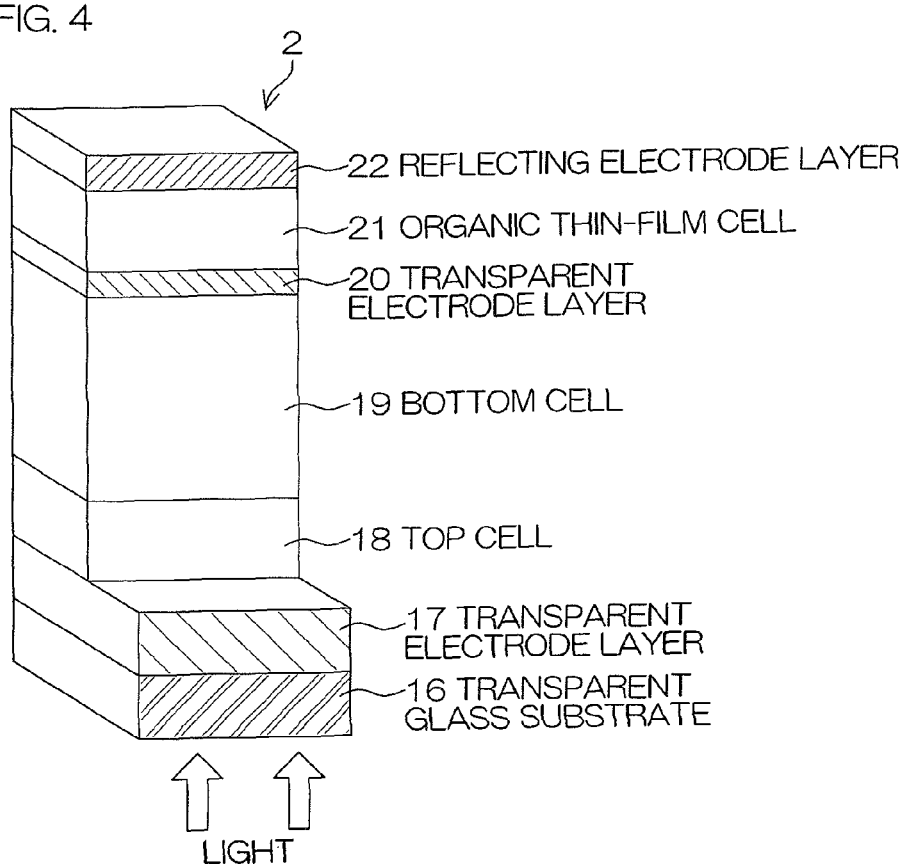
FIG. 4 is a schematic view of a tandem type hybrid solar cell in which the TOT derivative is incorporated in a semiconductor layer of an organic thin-film cell 21.

Further, hybridization (tandem arrangement) with a silicon-based solar cell is also possible. FIG. 4 is a schematic view of a cross section of a hybrid solar cell.

As shown in FIG. 4, in the hybrid solar cell 2, a transparent electrode layer 17 made of tin dioxide ($SnO_2$), etc., a top cell (a "cell" refers to a single solar cell device) 18 formed of amorphous silicon, and a bottom cell 19 formed of polycrystalline silicon are laminated on a transparent glass substrate 16, an organic thin-film cell 21 that uses the TOT derivative according to the present invention is formed via a transparent electrode layer 20 on the bottom cell 19, and a reflecting electrode layer 22 is laminated at the very top. The structure of the organic thin-film cell 21 is a laminate of the p-type semiconductor layer 13 and the n-type semiconductor layer 14 such as shown in FIG. 3. As mentioned above, the structure does not have to be a laminate and may instead be a bulk heterojunction structure and may include buffer layers and an i layer.

The silicon-based solar cell utilizes sunlight in an ultraviolet/visible range of wavelengths shorter than 800 nm and hardly contributes to photoelectric conversion in a near infrared to infrared region. Thus, by combining the organic thin-film cell 21 utilizing the TOT derivative at a rear side of the silicon-based cells 18 and 19 as shown in FIG. 4, light of the infrared region that passes through the silicon-based cells can be converted to an electric current. A conversion efficiency of a conventional silicon-based solar cell can thereby be improved further.

<Organic EL Device>

As shown in FIG. 5, an organic EL device 3 has a structure in which a transparent electrode layer 32, a hole injection layer 33, a hole transport layer 34, a light emitting layer 35, an electron transport layer 36, an electron injection layer 37, and a reflecting electrode layer 38 are laminated on a transparent glass substrate 31. In addition to the illustrated structure, layers that block electrons or holes are inserted as necessary. There are also structures that do not include an electron injection layer or a hole injection layer.

The TOT derivative according to the present invention is applicable to the electron transport layer 36 and the electron injection layer 37 as n-type semiconductor layers. In the organic EL device, factors that dominate important characteristics such as luminous efficiency and lifetime are largely dependent on mutual combinations of materials and thus a desired performance can be obtained by fine-tuning the frontier orbital band gaps, LUMO energy levels, interfacial contact state, etc., of the TOT derivative according to a light emitting material that is used.

To describe a method of manufacture briefly, the transparent electrode layer 32 is vapor deposited onto the transparent glass substrate 31 by the sputtering method, etc. The hole injection layer 33, the hole transport layer 34, and the light emitting layer 35 are then formed from above by the vacuum vapor deposition method or the coating method, and the electron transport layer 36 and the electron injection layer 37 that include the TOT derivative are then formed by the vacuum vapor deposition method or the coating method. Finally, the reflecting electrode layer 38 is formed on the electron injection layer 37 by the sputtering method, etc. Depending on the case, one or a plurality of layers among the hole injection layer 33, the hole transport layer 34, the electron transport layer 36, and the electron injection layer 37 may be omitted. As the coating method, for example, the spin coating method, inkjet method, spray coating method, gravure printing method, etc., may be adopted.

In the thin-film forming process, conditions must be set to optimize mutual stacking of molecules. Specifically, in the case of the vacuum vapor deposition method, the optimal conditions are set by adjusting such parameters as the temperatures, temperature ramp profiles, vapor deposition times of the vapor deposition source and the substrate, the distance between the vapor deposition source and the substrate, etc. In the case of the coating method, in addition to selecting the coating process, such as spin coating, inkjet, and gravure printing, optimal conditions are set by adjusting such parameters as the solvent type, concentration, temperature, and drying conditions of the coating solution.

With the TOT derivative, the frontier orbital energy levels can be controlled as suited by changing the functional group to be introduced as the substituent. Thus, in comparison to conventionally known n-type organic semiconductor materials, such as fullerene-based compounds, copper phthalocyanine-based compounds, an inherent potential of the light emitting material can be brought out maximally with ease. Further, as a characteristic not seen in conventional organic semiconductor devices, the TOT derivative can store electrons up to a tetraanion state to act as a buffer against localized concentration of current in the organic EL device and can thereby contribute to elongating the lifetime of the device.

Also, the material in the organic EL device that largely influences emission intensity and luminous efficiency is the light emitting layer, and the TOT derivative according to the present invention may also be used as a host material of the light emitting layer.

<Organic Field Effect Transistor>

Figure 7:
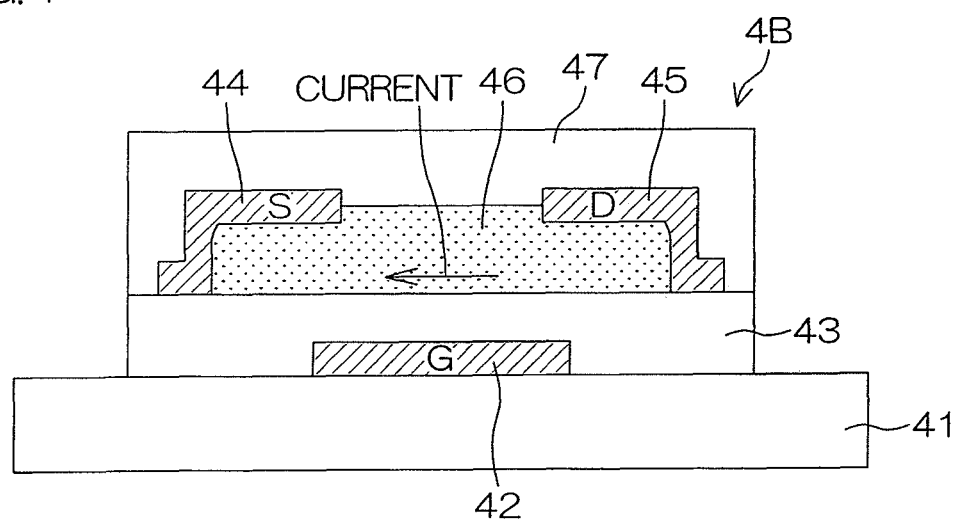
FIG. 7 is a schematic view of an organic transistor (top contact type) in which the TOT derivative is incorporated in the semiconductor layer 46.

Representative device structures of organic field effect transistors are shown in FIG. 6 and FIG. 7. FIG. 6 shows a bottom contact structure in which an organic semiconductor thin film is formed after preparing source and drain electrodes, and FIG. 7 shows a top contact structure in which the source and drain electrodes are prepared after forming the organic semiconductor thin film. In both structures, current flows along a channel layer formed in a lateral direction of the organic semiconductor thin film and this current is controlled by a voltage applied to a gate electrode.

FIG. 6 shows an organic field effect transistor 4A having a bottom contact structure, a source electrode 44 and a drain electrode 45 being formed on a gate insulating film 43, and a semiconductor layer 46 using the TOT derivative according to the present invention being formed as a film thereabove. To manufacture the organic transistor 4A, a metal layer that is to be a gate electrode 42 is formed on a substrate 41, and the gate insulating film 43, made of silicon dioxide or polyimide, etc., is formed thereabove. The source electrode 44 and the drain electrode 45 are patterned thereabove, the semiconductor layer 46 using the TOT derivative according to the present invention is then formed by the vapor deposition process or the coating process, and lastly, the entirety is protected by a sealing film 47.

FIG. 7 shows an organic field effect transistor 4B having a top contact structure, the semiconductor layer 46 using the TOT derivative according to the present invention is formed as a film on the gate insulating film 43, and the source electrode 44 and the drain electrode 45 are formed thereabove. To manufacture the organic field effect transistor 4B, the organic thin film using the TOT derivative according to the present invention is formed on the gate insulating film 43 by the vapor deposition process or the coating process, and the source electrode 44 and the drain electrode 45 are provided thereabove.

Furthermore, the reverse order is possible; that is, a structure in which the source and drain electrodes are formed on the substrate, the organic semiconductor film is provided thereabove, the gate insulating film is formed and the gate electrode (top gate structure) is formed thereabove.

By using the TOT derivative according to the present invention in the organic thin film, a field effect transistor of high operating frequency can be realized.

Besides the structures shown in FIG. 6 and FIG. 7, there is also a field effect transistor in which a Schottky barrier is formed between a gate metal and the semiconductor layer.

Such an organic field effect transistor is used, for example, as a TFT (Thin Film Transistor) for display drivers.

Although preferred embodiments of the present invention are described above, the present invention is not restricted to the above embodiments and various changes can be applied within the scope of the present invention.

EXAMPLES

<Manufacture of TOT Derivative>

The TOT skeleton is a rigid, planar π-electron system molecule made up of only carbon atoms and oxygen atoms. A TOT derivative is produced by introducing an electron-donating or electron-accepting functional group to the TOT skeleton.

A compound having the structure where the R=t-butyl group of the TOT derivative was synthesized according to the method described in Japanese Unexamined Patent Publication No. 2007-227186 (Patent Document 1).

A compound with the structure where R=isopropyl group was synthesized by the following method.

Under an argon atmosphere, 12.5 g (64 mmol) of 1-bromo-4-isopropylbenzene was placed in a 300 mL Schlenk flask, and 40 mL of carbon tetrachloride and 28.9 mL (384 mmol) of chloromethyl methyl ether were added. The mixture was cooled to −30° C., and after adding 17.1 g (128 mmol) of aluminum chloride, heated to 0° C., then stirred for 20 minutes, and thereafter heated to room temperature and then stirred for 5 minutes. The reaction solution was poured into ice water, and 100 mL of 2M hydrochloric acid and 100 mL of dichloromethane were added while stirring well. After separating the organic layer, the aqueous layer was extracted two times with 50 mL of dichloromethane, and then the organic layers were combined. The organic layer was then dried on anhydrous sodium sulfate and then filtered, and by then distilling off the dichloromethane, 15.6 g of 1-bromo-2-chloromethyl-4-isopropylbenzene was obtained as a transparent, pale-yellow oil.

31.1 g (126 mmol) of 1-bromo-2-chloromethyl-4-isopropylbenzene obtained by repeating the above reaction were placed in a 300 mL recovery flask and under an argon atmosphere, 160 mL (160 mmol) of a 1M methanol solution of sodium methoxide was added and heat-refluxing at 75° C. was performed for 11.5 hours. The reaction solution was thereafter allowed to cool to room temperature and then 100 mL of water, 200 mL of 2M hydrochloric acid, and 100 mL of dichloromethane were added. The organic layer was separated, the aqueous layer was extracted two times with 50 mL of dichloromethane, and then the organic layers were combined. The organic layer was then dried with anhydrous sodium sulfate and then filtered, and a crude product thereafter obtained by distilling off the dichloromethane was refined by column chromatography using 6% water-containing silica gel to obtain 23.4 g of 1-bromo-2-methoxymethyl-4-isopropylbenzene as a transparent, colorless oil.

Under an argon atmosphere, 3.47 g (14.3 mmol) of the 1-bromo-2-methoxymethyl-4-isopropylbenzene was placed in a 250 mL Schlenk flask, 80 mL of tetrahydrofuran (THF) was added to form a solution, and the solution was cooled to −90° C. 19.1 ml of a 1.53M n-pentane solution of t-butyl-lithium (29.2 mmol) was then dripped in slowly over a period of 45 minutes. The temperature was then gradually raised to −78° C., then stirring was performed for 1 hour, and thereafter the mixture was cooled again to −90° C., and 0.52 mL (4.29 mmol) of diethyl carbonate was added. The temperature was gradually raised to room temperature and 18 hours later, 100 mL of a pH 7 phosphate buffer was added. After separating the organic layer, the aqueous layer was extracted two times with 30 mL of ethyl acetate, and then the organic layers were combined. The organic layer was then dried with anhydrous sodium sulfate and then filtered, the solvent was distilled off, and then by recrystallization from hexane, 1.16 g of white solids were obtained. The white solids were placed in a 200 mL Schlenk flask and dissolved by adding 24 mL of trifluoroacetic acid under an argon atmosphere. After cooling to 0° C., 848 mg (22.4 mmol) of sodium borohydride were added in two portions. 30 minutes later, the trifluoroacetic acid was distilled off under reduced pressure, and 10 mL of water and 15 mL of a saturated sodium bicarbonate solution were added. After extracting three times with 10 mL of hexane, the organic layer was dried with anhydrous sodium sulfate, and by distilling off the solvent, 1.06 g of a triphenylmethane derivative were obtained as white solids. The white solids were placed in a 200 mL Schlenk flask and dissolved by adding 65 mL of dichloromethane under an argon atmosphere. Upon cooling to −78° C., 1.8 mL (19 mmol) of boron tribromide were added, and 25 minutes later, the temperature was raised to −40° C., and then stirring was performed for 1 hour while slowly raising the temperature further to −25° C. After adding 10 mL of methanol and 30 mL of a 2M aqueous solution of sodium hydroxide, the organic layer was separated, the aqueous layer was extracted two times with 20 mL of dichloromethane, and the organic layers were combined. The organic layer was then dried with anhydrous sodium sulfate and then filtered, and by distilling off the solvent, 1.3 g of a tribromo derivative were obtained as a yellow powder. The yellow powder was placed in a 200 mL recovery flask and suspended by adding 55 mL of dimethyl sulfoxide (DMSO), 8.7 g (104 mmol) of sodium bicarbonate was added, and stirred for 8 hours at 100° C. After cooling to room temperature, 100 mL of 2M hydrochloric acid, 150 mL of dichloromethane, and 100 mL of a saturated aqueous solution of sodium chloride were added. The organic layer was separated, the aqueous layer was extracted three times with 20 mL of dichloromethane, and then the organic layers were combined. The organic layer was then dried with anhydrous sodium sulfate and filtered, and the crude product obtained by distilling off the solvent was washed with ethyl acetate and hexane to obtain 913 mg of a triformyl derivative as a white powder.

A Jones reagent was prepared by placing 2.67 g (26.7 mmol) of chromium (VI) oxide in a 30 mL recovery flask and then adding 7.5 mL of water and 2.3 mL of concentrated sulfuric acid. 500 mg (1.10 mmol) of the triformyl derivative were placed in a 30 mL recovery flask and suspended by adding 10 mL of acetone. Upon then cooling to 0° C., 1.75 mL of the Jones reagent, cooled to 0° C., was added over a period of 5 minutes, and then the temperature was raised to room temperature. 24.5 hours later, the reaction solution was cooled to 0° C. and stirred upon adding 5 mL of isopropanol. Green solids that precipitated were separated by filtration, and 20 mL of water was added to the filtrate which was then extracted three times with 5 mL of dichloromethane. The organic layers were combined, extracted four times with 20 mL of a 1M aqueous solution of sodium hydroxide, and then 2M hydrochloric acid was added to the aqueous layer to adjust the pH to 1. The aqueous layer was then extracted four times with 10 mL of dichloromethane, the combined organic layer was dried with anhydrous sodium sulfate and filtered, and by then distilling off the solvent, 510 mg of a tricarboxylic acid derivative was obtained as a white powder.

Under an argon atmosphere, 300 mg of the tricarboxylic acid derivative were placed in a 20 mL Schlenk flask and dissolved in 15 mL of oxalyl chloride. After heat-refluxing at 65° C. for 45 minutes, the solution was allowed to cool, and then the excess oxalyl chloride was distilled off under reduced pressure. After washing the residue three times with 6 mL of dichloromethane, 27 mL of dichloromethane was added, the solution was cooled to −40° C., and 1 hour later, 796 mg (5.97 mmol) of aluminum chloride was added and the temperature was raised slowly to 0° C. Three hours later, the dichloromethane was distilled off under reduced pressure, 3 g of potassium carbonate were added to the residue, which was then stirred well and suspended in 20 mL of acetonitrile while cooling with ice. After adding ice, the organic layer was separated, the aqueous layer was extracted four times with 20 mL of acetonitrile, and the organic layers were combined. The organic layer was washed with 30 mL of a saturated sodium chloride solution, thereafter dried with anhydrous sodium sulfate and filtered, and the solvent was distilled off under reduced pressure. The solids obtained were washed with hexane and 497 mg of a potassium salt was thereby obtained as blue solids. The blue solids were placed in a 100 mL recovery flask and suspended in 40 mL of 2M hydrochloric acid. After stirring for 1 hour at 60° C., the solution was allowed to cool, and the insoluble matter was collected by filtration and washed with 2M hydrochloric acid to obtain 269 mg of a hydroxyl derivative as purple solids. The solids were placed in a 30 mL recovery flask, suspended in 4 mL of a 10 wt % aqueous solution of tetrabutylammonium hydroxide, and stirred for 1 hour at 60° C. The insoluble matter was collected by filtration, washed with distilled water at 60° C., and dried under vacuum at 70° C. to obtain 222 mg of an ammonium salt as blue solids. 150 mg (0.186 mmol) of the ammonium salt were placed in a 50 mL recovery flask, and 46 mg (0.186 mmol) of chloranil and dimethyl ether (DME) were added. After stirring for 40 minutes, 92 mg (0.372 mmol) of chloranil were added further and stirring was performed for 3 hours. The DME was distilled off under reduced pressure, the residue was dissolved in 18 mL of chloroform and refined in an alumina column, and by washing the obtained crude product with acetone, 56 mg of a TOT derivative with R=isopropyl group was obtained as brown solids.

<Measurement of Electronic Spectrum>

Figure 8:
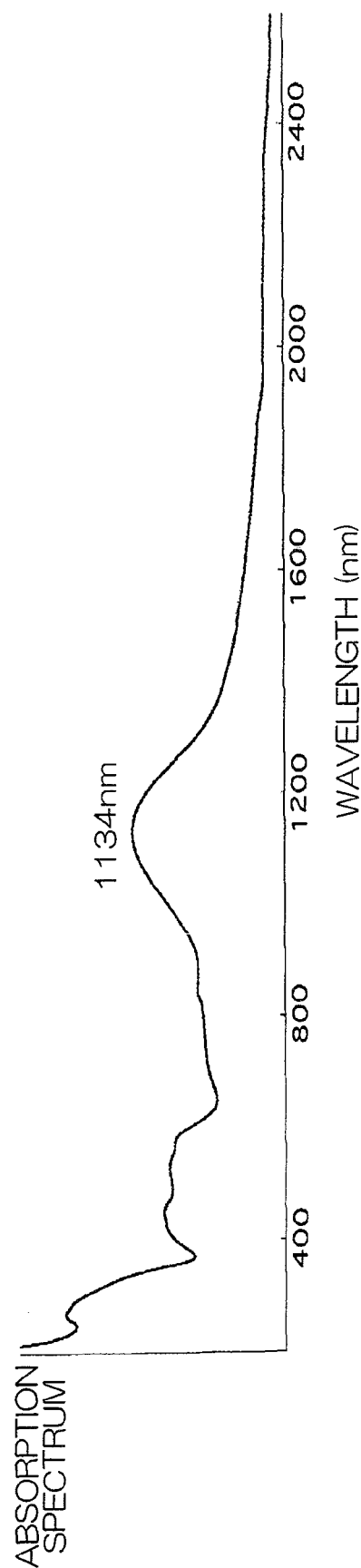
FIG. 8 is a diagram of an electron absorption spectrum measured from the TOT derivative.

An electronic spectrum in the infrared region of the tert-butyl derivative as an example of the TOT derivative was measured using a mixture of a fine powder of the tert-butyl derivative and a fine powder of KBr that was pelletized (referred to as a "KBr pellet") by applying pressure. As shown in FIG. 8, at 1134 nm (1.1 eV) there is a maxima, and low energy absorption was observed over a wide range from the longer wavelength side of that maxima into the infrared region. The absorption energy of 1.1 eV does not correspond to a SOMO-LUMO energy gap, but belongs to a transition between levels of a much greater level difference. The wavelength corresponding to the level difference of 0.2 eV lies far outside the graph of FIG. 8 to the right side and is outside the measurement range. However, it is unmistakable that a low-energy absorption peak of a wide range that certainly reaches the wavelength corresponding to the gap of 0.2 eV has been observed.

The origin of the low-energy absorption peak is considered to be absorption based on charge movement inside the one-dimensional column. As a result of evaluating FET characteristics of a monocrystal by the top contact method (FIG. 7), characteristics of an n-type semiconductor having a high mobility of 0.1 cm$^2$/Vs were exhibited. The high mobility is considered to reflect the high electronic interaction and electron accepting property inside the column.

<Measurement of Photoconductivity>

To check characteristics as a solar cell or an organic EL device, measurement of photoconductivity was performed using the tert-butyl derivative among the TOT derivatives. A photoconductivity measurement cell was prepared as follows.

Figure 9:
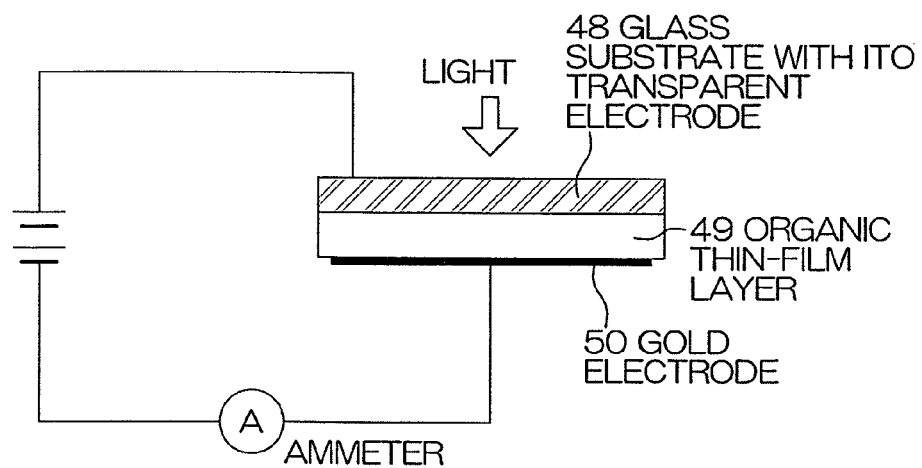
FIG. 9 shows a schematic view and a measurement circuit diagram of a photocurrent measurement cell in which the TOT derivative is incorporated in an organic thin-film layer 49.

The tert-butyl derivative and poly (3-hexylthiophene) (P3HT) were mixed at a weight ratio of 1:1 and dissolved in chloroform to prepare a 1 wt % solution, and the solution was spin coated onto a glass substrate 48 with an ITO conductive film to form an organic thin-film layer 49. Further, a gold (Au) electrode 50 was formed as a film thereabove by the vapor deposition method. The photoconductivity measurement cell and measurement circuit thus obtained is shown schematically in FIG. 9.

Light of a halogen lamp (50 W) was irradiated onto the cell from a distance of 10 cm and the photoconductivity (current-voltage characteristic) of the cell was measured. The results are shown together with the photoconductivity in darkness in FIG. 10.

Likewise for comparison, the photoconductivity was measured with a cell prepared only from P3HT and without using the n-type semiconductor and with a cell using $C_{60}$, which is a general n-type semiconductor, in place of the tert-butyl derivative. The measurement results in the case of only the P3HT is shown in FIG. 11, and the measurement results of the cell using $C_{60}$ are shown in FIG. 12.

Figure 10:
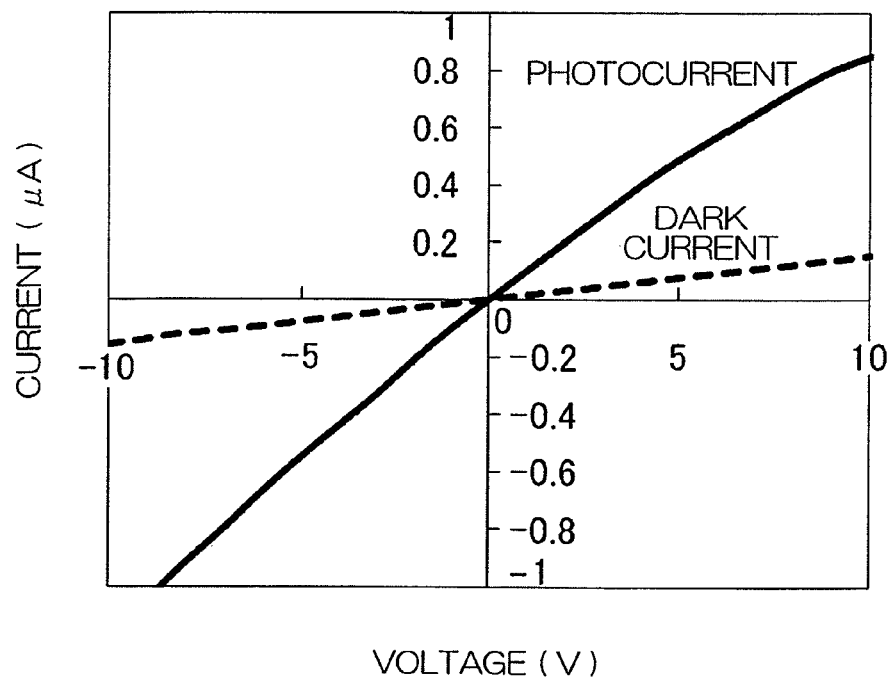
FIG. 10 is a graph of results of measuring a photoconductivity of TOT derivative-P3HT.
Figure 11:
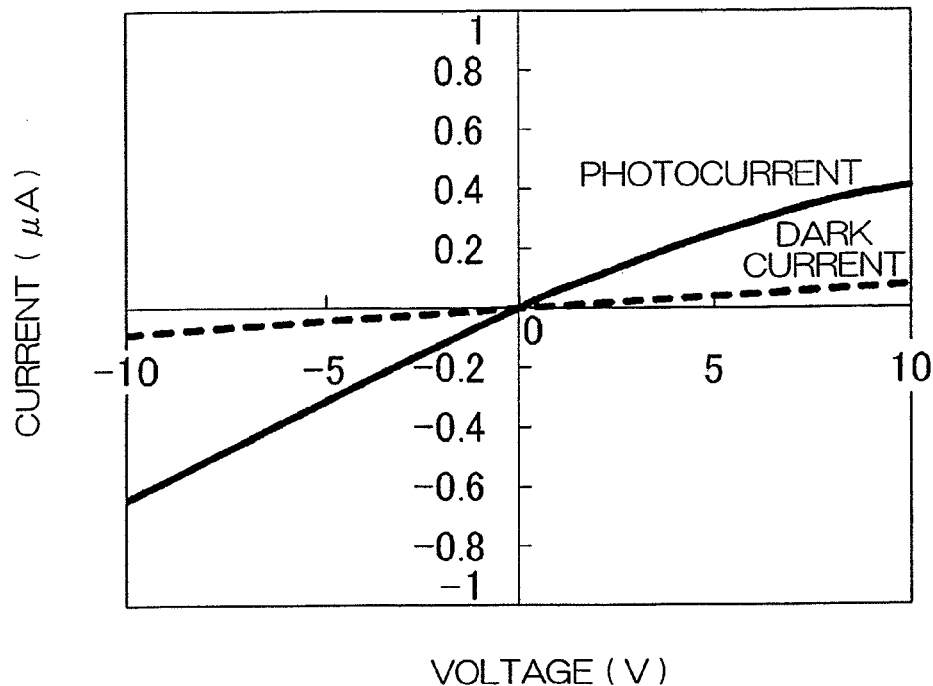
FIG. 11 is a graph of results of measuring a photoconductivity of P3HT for comparison.

With the graph of FIG. 10, although a large difference is not seen in regard to a dark current in comparison to the case of using only P3HT shown in FIG. 11, a degree of improvement in a photocurrent with respect to the dark current (difference of slope) is increased. That is, by light irradiation, a ratio of current with respect to voltage (I/V) is increased. This indicates improvement in conductivity based on light irradiation (decrease in internal resistance), that is, a presence of an internal photoelectric effect. It was thus possible to confirm the internal photoelectric effect due to the tert-butyl derivative.

Figure 12:
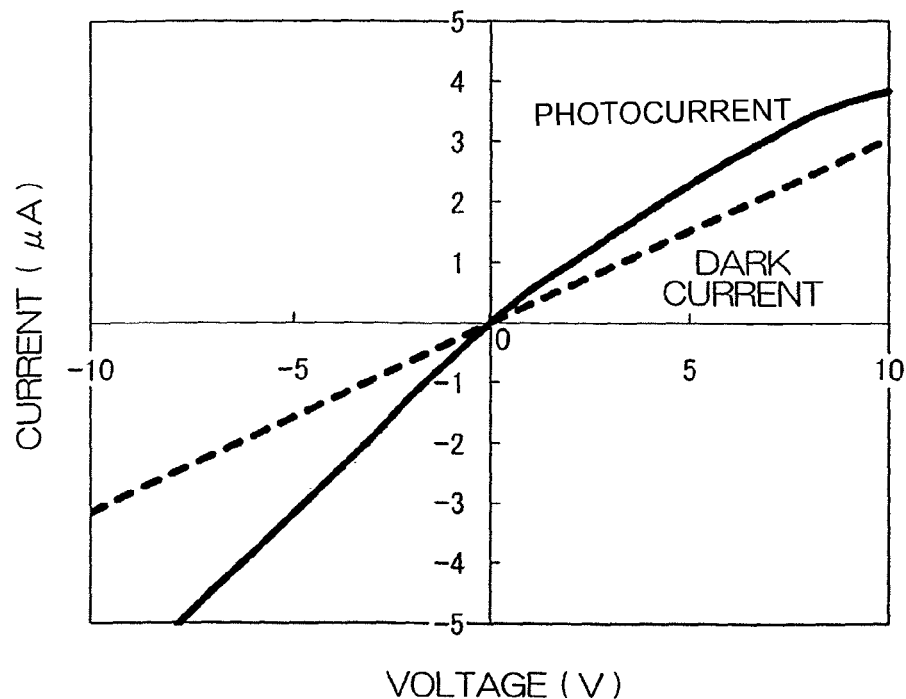
FIG. 12 is a graph of results of measuring a photoconductivity of $C_{60}$—P3HT for comparison.

Comparison of the tert-butyl derivative cell of FIG. 10 and the $C_{60}$ cell of FIG. 12 shows both to be large in the slope of the photocurrent. However, the two slopes differ from each other in the following way. In the case of the tert-butyl derivative (FIG. 10), it is presumed that the photocurrent results from an internal photoelectric effect because the degree of improvement in the photocurrent with respect to the dark current is large. However, in the case of $C_{60}$ (FIG. 12), the difference of slope of the photocurrent with respect to the dark current is small, thus indicating that the contribution of the internal photoelectric effect is small. It was thus possible to confirm that the internal photoelectric effect is more significant for the tert-butyl derivative case than for the $C_{60}$ case.

<Preparation of Organic Field Effect Transistor and Measurement of Mobility>

An organic field effect transistor with a bottom contact structure such as shown in FIG. 6 was prepared as follows. A conductive silicon wafer substrate having a thermal oxidation film functioning as a gate electrode and a gate insulating film was used, and a source electrode and a drain electrode were formed thereabove by gold vapor deposition. The TOT tert-butyl derivative monocrystal was formed thereon. A sealing film was not used and the mobility was measured in air.

Figure 13:
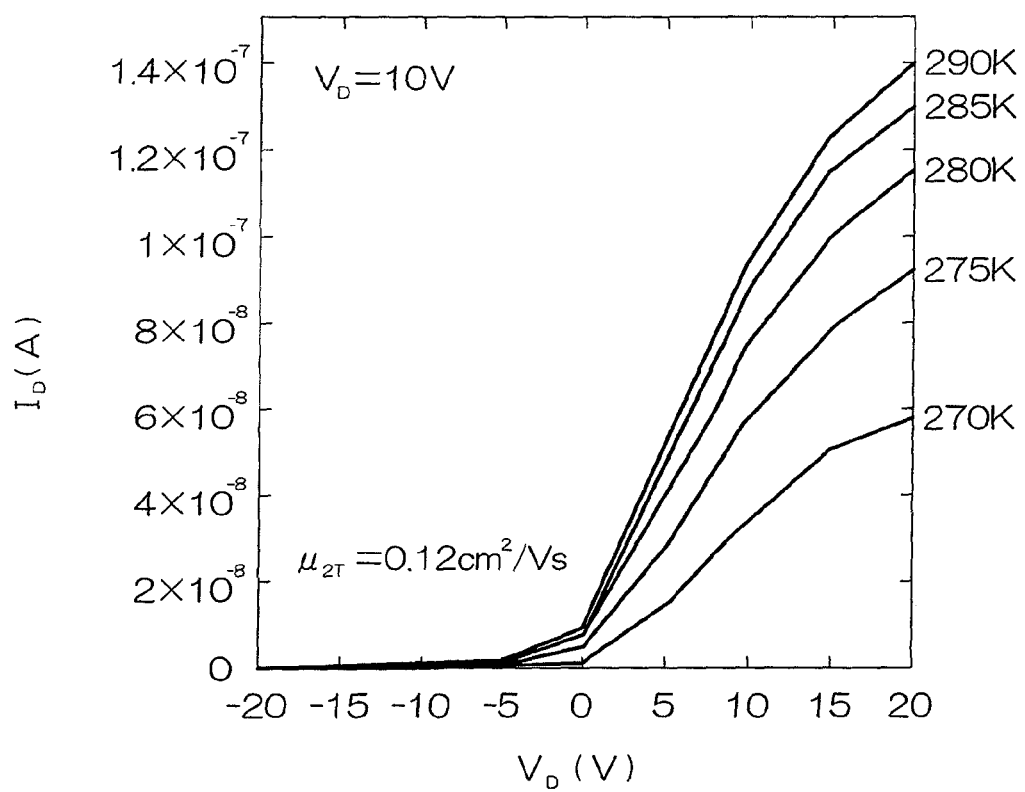
FIG. 13 is a graph in which a drain current $I_D$ is plotted against a gate voltage $V_G$ of a field effect transistor prepared with the TOT derivative as a semiconductor layer.

A graph of drain current $I_D$ is shown in FIG. 13, plotted by setting a drain voltage $V_D$ to 10V and varying a gate voltage $V_G$ from −20V to 20V. The mobility μ was calculated from a rate of increase in the drain current $I_D$ (slope of a straight line) using Formula (2).

$$I_D = C_i(V_G - V_{th})V_D \mu (L/W) \tag{2}$$

(In the above, $C_i$ is a capacitance of the gate insulating film, $V_{th}$ is a threshold voltage, L is a length of a conduction channel, and W is a width of the conduction channel.)

A mobility μ having a large value of 0.12 cm$^2$/Vs was obtained using the equation above. Further, it was confirmed that the TOT derivative is an n-type semiconductor that operates with stability in air. It was thus confirmed that a practical organic field effect transistor that capable of a high frequency can be obtained.

<Calculation of Energy Gap>

With the TOT derivative, the frontier orbital levels can be controlled as suited by molecular design, such as by changing the structure of the substituent, etc. LUMO energy levels, SOMO energy levels, and energy differences thereof (results of calculation by the ROB3LYP/6-31G//UB3LYP/6-31G method) of derivatives that are differed in the substituent R on the TOT skeleton are shown in Table 1.

TABLE 1

| R | KH$_2$ | OCH$_3$ | i-C$_3$H$_7$ | t-C$_4$H$_9$ | i-C$_3$F$_7$ | C$_6$H$_5$ | C$_6$F$_5$ | CN | COOH | NO$_2$ |
|---|---|---|---|---|---|---|---|---|---|---|
| LUMO energy level/eV | −2.18 | −2.56 | −2.44 | −2.45 | −3.62 | −2.56 | −3.21 | −3.67 | −3.70 | −3.97 |
| SOMO energy level/eV | −2.67 | −3.07 | −3.18 | −3.18 | −4.08 | −3.21 | −3.76 | −4.11 | −4.14 | −4.38 |
| SOMO-LUMO energy difference/eV | 0.49 | 0.51 | 0.74 | 0.73 | 0.46 | 0.65 | 0.55 | 0.44 | 0.44 | 0.41 |

Table 1 shows that in the case where the substituent R is an electron donating functional group ($NH_2$ or $OCH_3$), the SOMO energy level is comparatively high as predicted, and in the case where the substituent R is an electron accepting functional group (i-$C_3F_7$, $C_6F_5$, CN, COOH, or $NO_2$), the SOMO energy level is comparatively low. Also, in all cases, the SOMO-LUMO energy difference is small in comparison to the cases of the tert-butyl group and the isopropyl group.

The SOMO energy level can thus be varied in a range of approximately 1.7 eV from the highest level to the lowest level simply by selecting the substituent, and the SOMO-LUMO energy difference can be varied in a range of approximately 0.3 eV from the highest gap to the lowest gap. These are beneficial in terms of molecular design.

In the case where the tert-butyl group is selected as the substituent, a SOMO-LUMO energy difference of 0.73 eV is obtained and although this differs from the numerical value of 0.2 eV mentioned in the <SUMMARY OF THE INVENTION> section, this is considered to be simply due to a difference in the calculation method. The energy difference is actually considered to be in a range of 0.1 to 1.0 eV.

Another important point of substituent selection is introduction of intermolecular interactions other than spin-spin interactions (SOMO-SOMO interactions) and multidimensionalization of the crystal structure. As shown in FIG. 2, the TOT derivative has a crystal structure that is highly one dimensional in the longitudinal direction. This is considered to be because a strong non-bonding interaction is not present other than the strong π-π type SOMO-SOMO interaction (2500K, 5.0 kcal/μmol) due to the gigantic π-electron system and the electron spin that is broadly delocalized across the skeleton. In a case where an $NH_2$ group or a COOH group, etc. is introduced in such an electron spin system, with which intermolecular interactions are possible, formation of a crystal structure of high dimensionality having a structure in the lateral direction is predicted as well. Electron communication in the lateral direction can thus also be anticipated, and it may become possible to vary and adjust thin-film structures and properties as a semiconductor.

DESCRIPTION OF SYMBOLS

1 Organic thin-film solar cell
2 Hybrid solar cell
3 Organic EL device
12, 17, 32 Transparent electrode layer
13 p-type semiconductor layer
14 n-type semiconductor layer
15, 22, 38 Reflecting electrode layer
11, 16, 31 Transparent glass substrate
18 Top cell
19 Bottom cell
20 Transparent electrode layer
21 Organic thin-film cell
33 Hole injection layer
34 Hole transport layer
35 Light emitting layer
36 Electron transport layer
37 Electron injection layer
4A, 4B Organic transistor
41 Substrate
42 Gate electrode
43 Gate insulating film
44 Source electrode
45 Drain electrode
46 Semiconductor layer
47 Sealing film
48 Glass substrate with ITO transparent electrode
49 Organic thin-film layer
50 Gold electrode

What is claimed is:

1. An organic semiconductor device, comprising at least one semiconductor layer, and having light absorption performance in an infrared region,
   wherein the semiconductor layer contains a neutral radical compound of a trioxotriangulene (TOT) derivative that is shown in Chemical Formula (1) below as a semiconductor material:

[Formula 1]

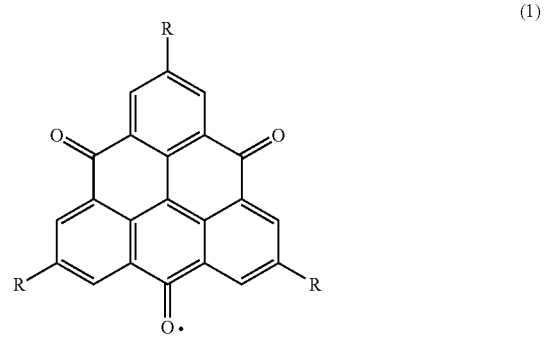

(1)

(In the above formula, "R" indicates a monovalent group),
   wherein an energy gap between a singly occupied molecular orbital and a lowest unoccupied molecular orbital of the neutral radical compound of Chemical Formula (1) is in a range of 0.1 to 1.0 eV, and wherein infrared radiation passing through the semiconductor layer is absorbed and converted to an electric current,
   wherein the neutral radical compound of Chemical Formula (1) has the monovalent group R being a monovalent functional group selected from the group consisting of a proton, a methyl group, an ethyl group, an n-propyl group, an isopropyl group, an n-butyl group, a t-butyl group, a cyclohexyl group, a 2,2,2-trifluoroethyl group, a pentafluoroethyl group, a heptafluoroisopropyl group, a phenyl group, a 4-methoxyphenyl group, a pentafluorophenyl group, a naphthyl group, a benzyl group, a methoxy group, an ethoxy group, an n-butoxy group, a t-butoxy group, a phenyloxy group, an amino group, a dimethylamino group, a diethylamino group, an isopropylamino group, a carboxyl group, a methoxycarbonyl group, an ethoxycarbonyl group, an isopropoxycarbonyl group, a t-butoxycarbonyl group, a trifluoromethoxycarbonyl group, a cyano group, a nitrile group, and halogens.

2. The organic semiconductor device according to claim 1, wherein the neutral radical compound of Chemical Formula (1) is layered in a columnar form in a crystalline arrangement in the semiconductor layer.

3. The organic semiconductor device according to claim 1, wherein the organic semiconductor device is an organic thin-film solar cell.

4. The organic semiconductor device according to claim 3, wherein the semiconductor layer is an n-type semiconductor layer that forms a p-n junction with a p-type organic semiconductor material.

5. The organic semiconductor device according to claim 3, wherein the organic thin-film solar cell is a hybrid solar cell combined with a silicon-based solar cell.

6. The organic semiconductor device according to claim 1, wherein the semiconductor layer has a carrier mobility of 0.01 to 20 cm2/Vs.

7. The organic semiconductor device according to claim 1, wherein the semiconductor layer is obtained by forming the neutral radical compound of Chemical Formula (1) into a film by a coating process.

* * * * *

UNITED STATES PATENT AND TRADEMARK OFFICE
CERTIFICATE OF CORRECTION

PATENT NO. : 8,933,437 B2  
APPLICATION NO. : 13/131003  
DATED : January 13, 2015  
INVENTOR(S) : Yasushi Morita et al.

Page 1 of 1

It is certified that error appears in the above-identified patent and that said Letters Patent is hereby corrected as shown below:

On the Title Page, Item (54) and in the Specification, column 1, line 1, delete "Material" and insert --Device--

Signed and Sealed this  
Thirtieth Day of June, 2015

Michelle K. Lee  
*Director of the United States Patent and Trademark Office*

UNITED STATES PATENT AND TRADEMARK OFFICE
CERTIFICATE OF CORRECTION

PATENT NO. : 8,933,437 B2  Page 1 of 1
APPLICATION NO. : 13/131003
DATED : January 13, 2015
INVENTOR(S) : Yasushi Morita et al.

It is certified that error appears in the above-identified patent and that said Letters Patent is hereby corrected as shown below:

Title Page, Item (73) insert second assignee
--OSAKA UNIVERSITY, Suita-shi, (JP)--

Signed and Sealed this
Seventh Day of June, 2016

Michelle K. Lee
*Director of the United States Patent and Trademark Office*